United States Patent
Nishikawa et al.

(10) Patent No.: US 7,470,490 B2
(45) Date of Patent: Dec. 30, 2008

(54) MATERIAL FILM FOR A MASK FILM, PROCESS FOR PRODUCING A MASK FILM USING THE MATERIAL FILM AND PROCESS FOR PRODUCING A PRINTING PLATE OF A PHOTOSENSITIVE RESIN

(75) Inventors: Takehiko Nishikawa, Saitama (JP); Soichiro Fujinaga, Saitama (JP)

(73) Assignee: Lintec Corporation, Tokyo (JP)

( * ) Notice: Subject to any disclaimer, the term of this patent is extended or adjusted under 35 U.S.C. 154(b) by 881 days.

(21) Appl. No.: 11/048,484

(22) Filed: Feb. 1, 2005

(65) Prior Publication Data

US 2005/0271950 A1    Dec. 8, 2005

(30) Foreign Application Priority Data

Feb. 6, 2004    (JP) .............................. 2004-030694

(51) Int. Cl.
*G03F 5/00*    (2006.01)

(52) U.S. Cl. ........................ 430/5; 430/300; 430/306; 430/945

(58) Field of Classification Search ....................... None
See application file for complete search history.

(56) References Cited

U.S. PATENT DOCUMENTS 4,132,168 A * 1/1979 Peterson ..................... 430/296
6,579,660 B1 * 6/2003 Figov ....................... 430/273.1
2002/0045131 A1 4/2002 Nagase et al.
2003/0143471 A1 7/2003 Mitsuhashi et al.
2005/0115920 A1 * 6/2005 Hiller et al. ................... 216/10

FOREIGN PATENT DOCUMENTS

| JP | 05-24172 A | 2/1993 |
| JP | 10-67088 A | 3/1998 |
| JP | 2003-215777 A | 7/2003 |

\* cited by examiner

*Primary Examiner*—John A. McPherson
(74) *Attorney, Agent, or Firm*—Frishauf, Holtz, Goodman & Chick, P.C.

(57) ABSTRACT

A material film for a mask film comprising a substrate film transmitting ultraviolet light and a resin layer not transmitting ultraviolet light disposed on one face of the substrate film, the resin layer having a color which can be eliminated by irradiation with laser beams, a transmittance of ultraviolet light of 0.1% or smaller, a thickness of 0.1-30 μm and an average surface roughness on a central line Ra of 0.1-3 μm and comprising carbon black having an average particle diameter of 20-50 nm and a specific surface area of 70-150 m$^2$/g. The resin layer exhibits uniform transparency at portions the color of which is eliminated and suppresses formation of scratches. The mask film is easily positioned in preparation of great printing plates and good contact is easily attained throughout the entire surface suppressing containment of air between the mask film and the printing plate material.

18 Claims, No Drawings

MATERIAL FILM FOR A MASK FILM, PROCESS FOR PRODUCING A MASK FILM USING THE MATERIAL FILM AND PROCESS FOR PRODUCING A PRINTING PLATE OF A PHOTOSENSITIVE RESIN

BACKGROUND OF THE INVENTION

1. Field of the Invention

The present invention relates to a material film for a mask film, a process for producing a mask film using the material film and a process for producing a printing plate of a photosensitive resin. More particularly, the present invention relates to a material film for a mask film advantageously used for preparation of a mask film which is used for preparation of a printing plate of a photosensitive resin such as a flexographic printing plate, wherein a resin layer not transmitting ultraviolet light in the material film exhibits uniform transparency at portions the color of which are eliminated by irradiation with laser beams and suppresses formation of scratches, and the mask film can be easily positioned in preparation of great printing plates and, in attaching with the printing plate material, can easily be attached at the entire surface and suppresses formation of bubbles; a process for producing a mask film using the material film; and a process for producing a printing plate of a photosensitive resin using the mask film.

2. Description of Related Art

Printing plates of a photosensitive resin such as flexographic printing plates, which are formed by irradiating a photosensitive resin layer of a printing plate material having the photosensitive resin layer with light through a mask film used as a negative film having a desired pattern, followed by removing portions of the photosensitive resin layer not exposed to the light by washing, have heretofore been known.

The mask film used for preparing the printing plate of a photosensitive resin is produced, in general, in accordance with a photographic process using silver salts or various printing processes such as a process using a laser printer. However, these processes cannot be used for preparing a mask having a great size. For example, when a mask having a great size such as the size of news paper is required, two or more mask films are used and combined together in a manner such that an image is formed without discrepancy. Moreover, the photographic process has a drawback in that procedures are complicated since the operations must be conducted in a dark room specific for the photographic process and treatments with a plurality of chemicals are required although the photographic process provides excellent resolution. On the other hand, in the case of the printing process, the operation is simple since a pattern can be formed directly by a printer using digital data. However, the process provided by ZANTE Company (a United States company) using a laser printer has drawbacks in that a treatment with a chemical is necessary to improve the property of a mask film not transmitting light and, moreover, the resolution is not sufficient.

As the technology using laser beams in the field of preparing printing plates, for example, a resin printing plate having depressed portions for printing which are formed by irradiating desired portions of a resin layer in a printing plate material having the resin layer on the surface with laser beams so that the desired portions of the resin layer are sublimed or decomposed (for example, Japanese Patent Application Laid-Open No. Heisei 5(1993)-24172) and a printing plate which is formed, using a resin printing plate material having a resin layer sensitive to ionizing radiation and a layer not transmitting ionizing radiation disposed on a substrate, by removing portions of the layer not transmitting ionizing radiation corresponding to a printing image by irradiation with laser beams, followed by irradiating the portions of the resin layer sensitive to ionizing radiation corresponding to the portions removed above with ionizing radiation and then by subjecting the portions of the resin layer sensitive to ionizing radiation irradiated above to a development treatment (for example, Japanese Patent Application Laid-Open No. Heisei 10(1998)-67088), have been disclosed.

However, in the above technology, a printing plate is prepared by directly irradiating a resin printing plate material with laser beams without using a mask film, and the technology is not related to the production of a mask film.

Under the above circumstances, the present inventors proposed a technology providing a material film for a mask film which is advantageously used for producing a mask film used for preparing a printing plate of a photosensitive resin such as a flexographic printing plate, does not require treatments with chemicals, provides excellent resolution by etching with laser beams and can be used for preparing a printing plate having a great size, and a process for producing a mask film using the material film (for example, Japanese Patent Application Laid-Open No. 2003-215777).

However, although the mask film obtained by using the above material film for a mask film has the advantageous properties described above, the mask film is not always satisfactory due to drawbacks in that an unevenly coated layer of the resin layer not transmitting ultraviolet light tends to be formed which directly causes fluctuations in the transmission of light in the portion the color of which is eliminated with leaser beams, that scratches are formed in the resin layer not transmitting ultraviolet light. Furthermore, in the preparation of printing plates having a great size, difficulties due to excessively strong attaching between the printing plate material before the irradiation and the resin layer not transmitting ultraviolet light arise, for example, in positioning of the mask film with the printing plate material or in removing the contained air in some portions between the printing plate material and the resin layer not transmitting ultraviolet light resulting in insufficient contact between the mask film and the printing plate material which results in that a precise printing plate cannot be obtained since the irradiation is conducted while the printing plate material and the mask film are not sufficiently attached to each other.

For the material film for a mask film, a resin layer not transmitting ultraviolet light exhibiting improved scratch resistance and adhesion with the substrate film has been desired so that the resin layer not transmitting ultraviolet light does not have scratches or is not peeled from the substrate film during handling of the material film and during working.

SUMMARY OF THE INVENTION

Under the above circumstances, the present invention has an object of providing a material film for a mask film which comprises a resin layer not transmitting ultraviolet light and exhibiting excellent scratch resistance and excellent adhesion with a substrate film and is advantageously used for preparation of a mask film used for preparation of a printing plate of a photosensitive resin such as a flexographic printing plate, wherein the resin layer not transmitting ultraviolet light in the material film exhibits uniform transparency at portions the color of which is eliminated by irradiation with laser beams and suppresses formation of scratches, and the mask film can be easily positioned in preparation of printing plates having a great size and, in attaching with the printing plate material, can be easily attached throughout the entire surface and suppresses containment of air between the printing plate material and the mask film; a process for producing a mask film using the material film; and a process for producing a printing plate of a photosensitive resin using the mask film.

As the result of intensive studies by the present inventors, it was found that the above object could be achieved by a material film having a resin layer not transmitting ultraviolet light which was disposed on one face of a substrate transmitting ultraviolet light, contained carbon black having specific properties as the blackish pigment and had a surface roughness expressed as the average roughness at the central line Ra in a specific range. The present invention has been completed based on this knowledge.

The present invention provides:

(1) A material film for producing a mask film, said material film comprising a substrate film transmitting ultraviolet light and a resin layer not transmitting ultraviolet light which is disposed on a face of the substrate film, wherein said resin layer has a color which is capable of being eliminated by irradiation with laser beams, has a transmittance of ultraviolet light of 0.1% or smaller before irradiation of the laser light, and has a thickness of 0.1 to 30 µm, and wherein said resin layer comprises carbon black having an average particle diameter of 20 to 50 nm and a specific surface area of 70 to 150 $m^2/g$ as a blackish pigment and has an average surface roughness on a central line Ra of 0.1 to 3 µm;

(2) A material film for producing a mask film according to (1), wherein the resin layer not transmitting ultraviolet light comprises at least one of vinyl chloride-vinyl acetate copolymers and polyurethane-based resins as a resin;

(3) A material film for producing a mask film according to any one of (1) and (2), wherein a ratio of a content by weight of the blackish pigment and a content by weight of the resin in the resin layer not transmitting ultraviolet light is 0.5:1 to 1:1;

(4) A material film for producing a mask film according to any one of (1), (2) and (3), wherein a surface of the resin layer not transmitting ultraviolet light has a pencil hardness of H or greater;

(5) A process for producing a mask film which comprises etching a resin layer not transmitting ultraviolet light in the material film for producing a mask film of any one of (1) to (4) by irradiation with a laser beam and forming a desired pattern;

(6) A process for producing a printing plate of a photosensitive resin which comprises irradiating a photosensitive layer of a printing plate material with an active light through a mask film of (5) and developing the irradiated photosensitive layer; and (7) A process according to (6), wherein the printing plate of a photosensitive resin is a flexographic printing plate.

DESCRIPTION OF THE PREFERRED EMBODIMENTS

The material film for a mask film of the present invention is a material film for a mask film which comprises a substrate film transmitting ultraviolet light and a resin layer not transmitting ultraviolet light disposed on one face of the substrate and is used for preparing a printing plate by etching desired portions of the resin layer by irradiation with laser beams.

The substrate film used for the material film for a mask film is not particularly limited as long as the substrate film transmits ultraviolet light. A film having a transmittance of active light for curing a printing plate material of a photosensitive resin of 20% or greater at the characteristic wavelength of the light source (for example, a 360 nm UV lamp) and exhibiting excellent heat resistance, dimensional stability under heating and mechanical properties is preferable. Examples of the substrate film include films of polyester-based resins such as polyethylene terephthalate, polybuthylene terephthalate and polyethylene naphthalate, polyamide-based resins, polyimide-based resins, polyamide imide-based resins, polyether ether ketone-based resins, polyether sulfone-based resins, polyether imide-based resins, polysulfone-based resins, polyphenylene sulfide-based resins, polyester imide-based resins and mixture of these resins. The thickness of the substrate film is selected, in general, in the range of 25 to 500 µm and preferably in the range of 100 to 300 µm.

In the present invention, the face of the substrate film for disposing the resin layer not transmitting ultraviolet light may be subjected to the mat treatment, where desired. By the mat treatment of the substrate film, the average roughness at the central line Ra of the surface of the resin layer not transmitting ultraviolet light can be adjusted at a desired value. Examples of the mat treatment include the chemical treatment and the sand mat treatment. The roughness obtained by the treatment is about 0.05 to 2.0 µm as Ra.

In the material film for a mask film of the present invention, the average thickness of the resin layer not transmitting ultraviolet light which is disposed on one face of the above substrate film is selected in the range of 0.1 to 30 µm. When the thickness is smaller than 0.1 µm, it is difficult that the desired property of suppressing transmission of light is obtained. When the thickness exceeds 30 µm, the accuracy of parting lines in printing decreases. Moreover, there is the possibility that it takes a longer time for etching with laser beams and the mask film is deformed due to the heat generated by the laser beams. It is preferable that the average thickness is in the range of 0.5 to 20 µm and more preferably in the range of 0.8 to 10 µm.

The resin layer not transmitting ultraviolet light is selected in a manner such that the material film for a mask film of the present invention has a transmittance of ultraviolet light of 0.1% or smaller before irradiation with laser beams. When the transmittance exceeds 0.1%, there is the possibility that the resolution is insufficient when a pattern corresponding to the pattern on the mask film is formed by irradiating the photosensitive resin layer with the active light via the mask film obtained by using the material film for a mask film, followed by developing the irradiated photosensitive layer.

The resin layer not transmitting ultraviolet light comprises, as described above, a blackish pigment so that the resin layer does not transmit ultraviolet light. As the blackish pigment, carbon black having an average particle diameter of 20 to 50 nm and a specific surface area of 70 to 150 $m^2/g$ is used. By using carbon black having the above average particle diameter and the above specific surface area, the resin layer not transmitting ultraviolet light exhibits excellent adhesion with the substrate film. The types of carbon black include channel black, furnace black, acetylene black and thermal black in accordance with the process of production. Any of these types of carbon black can be used.

In the present invention, blackish pigments other than carbon black such as black chromium oxide, titanium black, black iron oxide, black organic pigments such as aniline black and mixed organic pigments obtained by mixing at least two organic pigments selected from red, blue, green, violet, yellow, cyan and magenta pigments so as to exhibit an artificial black color may be used.

The resin used for the resin layer not transmitting ultraviolet light is not particularly limited as long as dispersion of the blackish pigment is excellent so that the resin layer suppresses transmission of ultraviolet light sufficiently even when the thickness of the layer formed with the resin is small and the surface of the resin layer does not have tackiness. Various resins can be used for the resin layer not transmitting ultraviolet light. Examples of the resin include vinyl chloride-vinyl acetate copolymers, ethylene-acrylate-based copolymers, styrene-based resins, polyolefin-based resins, acrylic resins, vinyl acetate-based resins, polyurethane-based resins, vinyl chloride-based resins and vinylidene chloride-based resins. The resins may be used singly or in combination of two or more. Among the above resins, vinyl chloride-vinyl acetate copolymers, polyurethane-based resins and mixed resins of vinyl chloride-vinyl acetate copolymers and polyurethane-based resins are preferable.

When the resin layer having the above composition is irradiated with laser beams of a great output power, the blackish pigment absorbs the energy of the laser beams having a selected wavelength, and the irradiated portion is locally heated. The blackish pigment and the resin in the heated portion of the resin layer are decomposed or sublimed by the heat, and the blackish pigment disappears. Thus, the color of the irradiated portion of the resin layer is eliminated, and the resin layer transmits ultraviolet light. It is preferable that the portion of the material film for a mask film the color of which is eliminated by irradiation with the laser beams has a transmittance of ultraviolet light of 20% or greater similarly to that of the substrate film transmitting ultraviolet light.

It is preferable that the ratio of the content by weight of the blackish pigment to the content by weight of the resin is in the range of 0.5:1 to 1:1 so that the transmittance of ultraviolet light before the irradiation of the resin layer not transmitting ultraviolet light with laser beams is 0.1% or smaller.

In the present invention, uneven formation of the coating film can be suppressed by using the carbon black having the average particle diameter and the specific surface area described above and forming the resin layer not transmitting ultraviolet light in a manner such that the ratio of the contents by weight of the resin and the carbon black is in the above range.

In the present invention, the above resin layer can be formed by preparing a coating fluid comprising a suitable solvent, the above blackish pigments and the above resin, followed by applying the prepared coating fluid to one face of the substrate film in accordance with a conventional coating process such as the bar coating process, the knife coating process, the roll coating process, the blade coating process, the die coating process and the gravure coating process and by drying under heating and curing the formed coating layer.

It is required that the resin layer not transmitting ultraviolet light formed as described above has a surface roughness in the range of 0.1 to 3 μm as the average roughness at the central line Ra. When the value of Ra is within the above range, positioning on a printing plate material is easy in the preparation of a printing plate having a great size, and the efficiency in the production can be increased since the air contained during attaching with the printing plate can be removed easily. It is preferable that the value of Ra is in the range of 0.2 to 1.0 μm.

The method for adjusting the surface roughness is not particularly limited. For example, the surface roughness is adjusted, for example, by subjecting the surface of the substrate film where the resin layer not transmitting ultraviolet light is disposed to the mat treatment by sand blasting or the like method, by adding a filler to the substrate film itself, by adding a filler to the resin layer not transmitting ultraviolet light, or by subjecting the surface to the mat treatment by pressing an emboss roll to the surface. As the filler added to the substrate film or the resin layer not transmitting ultraviolet light, conventional inorganic fillers such as synthetic silica, titanium oxide, aluminum hydroxide and calcium carbonate and conventional organic fillers can be used.

It is preferable that the surface of the resin layer obtained as described above has a pencil hardness of H or greater. When the surface has a pencil hardness lower than H, the resin layer not transmitting ultraviolet light in the mask film obtained by using the material film for a mask film of the present invention tends to have damages and there is the possibility that the accuracy of printing decreases. In the present invention, a clear coating layer comprising an acrylic resin may be formed on the above resin layer not transmitting ultraviolet light to protect the resin layer, where desired.

The mask film in the present invention can be prepared by etching the resin layer not transmitting ultraviolet light in the material film for a mask film obtained as described above by irradiation with laser beams and forming a desired pattern.

As the laser oscillator used in the above process, for example, an infrared laser such as a carbon dioxide gas laser (the wavelength of oscillation: 1064 nm), a neodymium YAG laser (the wavelength of oscillation: 1064 nm) and a neodymium glass laser (the wavelength of oscillation: 1064 nm) can be used. Among the above laser oscillators, neodymium YAG laser is preferable. The laser oscillator may be any of the continuous oscillation type or the pulse oscillation type. The output power can be suitably selected in accordance with the thickness of the resin layer not transmitting ultraviolet light and the type of the resin. When the oscillator of the continuous oscillation type is used, in general, the output power is in the range of about 0.5 to 10 kW.

It is preferable that an apparatus allowing irradiation of any desired portions by the digital control is used as the laser oscillator. When such an apparatus is used, the pattern of printing is memorized by a computer as digital data, and the mask film can be prepared by the computer control.

The application of the mask film prepared in accordance with the present invention is not particularly limited. The mask film can be used for various applications in which a film of the transmission type having a desired pattern is used as the mask. For example, the mask film is advantageously used as the mask for preparation of a printing plate of a photosensitive resin. Examples of the printing plate of a photosensitive resin to which the present invention is applied include the flexographic printing plate, the letter press printing plate, the offset printing plate, the gravure printing plate and the screen printing plate. Among these applications, it is preferable that the present invention is applied to the negative film used in the preparation of the flexographic printing plate.

A solder resist is used in the production of a printed circuit board to form a coating film on the entire surface of the circuit conductor except the portion used for soldering. When electronic members are soldered to the printed circuit board, the solder resist plays the role of a protective film for preventing attachment of solder to portions other than the portions necessary for the soldering and preventing corrosion of the circuit conductor with oxygen and moisture by direct exposure to the air.

As the solder resist, in general, a solder resist comprising a photosensitive resin which is developed with a dilute alkali is used. The solder resist is used as follows: a substrate of a printed circuit is coated with the solder resist; the surface of the formed coating layer is dried in a temporary drying step until tackiness is not exhibited; and the solder resist thus formed is exposed to light via a mask film, subjected to the development treatment with a dilute alkaline solution and cured by heating.

The mask film obtained in the present invention can be used also as the mask film of a solder resist.

The printing plate of a photosensitive resin in the present invention can be prepared by using the mask film described above. Examples of the printing plate of a photosensitive resin include various printing plates described above. Among these printing plates, the flexographic printing plate is preferable.

For preparing the flexographic printing plate, for example, a printing plate material which is made of an uncured photosensitive resin soluble in a developing solution (a washing solution) and has a sheet form is used. The portion of the photosensitive resin irradiated with an active light such as ultraviolet light becomes insoluble in the developing solution due to curing by a reaction such as crosslinking and polymerization. The printing plate material occasionally has a structure having a plurality of layers comprising a substrate layer of a rubbery elastomer such as polyisoprene and NBR.

In general, the flexographic printing plate can be prepared in accordance with the following process.

The back face of the flexographic printing plate material is subjected to the preliminary exposure to ultraviolet light. The mask film obtained in accordance with the present invention and having a desired pattern is used as the negative film and closely attached to the back face of the printing plate material in a manner such that the resin layer not transmitting ultraviolet light of the mask film is attached to the printing plate material. The flexographic printing plate material is subjected to the major exposure to ultraviolet light via the attached mask film. Then, the mask film is removed, and the remaining printing plate material is treated by development (washing) to remove the resin in the unexposed portions, followed by drying. The resultant printing plate material is further subjected to the post-exposure to ultraviolet light, and the desired flexographic printing plate can be obtained. For each exposure to ultraviolet light, in general, ultraviolet light in the wavelength range of 300 to 400 nm is used.

The flexographic printing plate prepared as described above has, in general, a Shore A hardness of about 40 to 50.

To summarize the advantages obtained by the present invention, the material film for a mask film comprises a resin layer not transmitting ultraviolet light and exhibiting excellent scratch resistance and excellent adhesion with a substrate film and is advantageously used for preparation of a mask film used for preparation of a printing plate of a photosensitive resin such as a flexographic printing plate. The resin layer not transmitting ultraviolet light in the material film exhibits uniform transparency at portions the color of which is eliminated by irradiation with laser beams and suppresses formation of scratches, and in preparation of printing plates having a great size, the mask film can easily be positioned on the printing plate material and good contact throughout the entire surface of the printing plate material can be attained in attaching the mask film on the printing plate material suppressing containment of air between the mask film and the printing plate material.

EXAMPLES

The present invention will be described more specifically with reference to examples in the following. However, the present invention is not limited to the examples.

The properties in Examples and Comparative Examples were evaluated in accordance with the following methods.

(1) Transmittance of Ultraviolet Light of a Resin Layer not Transmitting Ultraviolet Light Using a spectrophotometer for ultraviolet and visible light, the transmittance at a wavelength of 360 nm was measured before and after irradiation with laser beams.

(2) Adhesion of a Resin Layer not Transmitting Ultraviolet Light

The test of adhesion of a resin layer not transmitting ultraviolet light with a cellophane pressure sensitive adhesive tape was conducted in accordance with the method of Japanese Industrial Standard K 5600, and the adhesion was evaluated in accordance with the following criteria. The used cellophane pressure sensitive adhesive tape was manufactured by NICHIBAN Co., Ltd. with the registered trade name of "CELLOTAPE",No. LP-24.

Criteria of Evaluation:
0: No peeled portions
1: Small peeled portions at intersections of cutting
2: Peeled along edges of cutting and/or at intersections of cutting
3: Peeled partially or entirely along edges of cutting and/or peeled partially or entirely at some portions in sections of the grid
4: Peeled partially or entirely along edges of cutting and/or peeled partially or entirely in several sections of the grid
5: Peeled to a great degree exceeding the above conditions (3) Surface Roughness Ra of a Resin Layer not Transmitting Ultraviolet Light The average roughness at the central line Ra was measured using a surface roughness meter [manufactured by MITUTOYO Corporation; a roughness meter of the contact type; "SV3000S4"].

(4) Slipping Property Against a Printing Plate Material of a Photosensitive Resin A printing plate material of a photosensitive resin (a flexographic printing plate material of a photosensitive resin; [manufactured by DUPONT Company; the trade name: "CYREL AQS"; the thickness: 1.7 mm]) and a resin layer not transmitting ultraviolet light were closely attached to each other, and the slipping property (the workability in positioning) was evaluated.

good: excellent slipping property, hence excellent workability
poor: poor slipping property, hence poor workability (5) Pencil Hardness of the Surface of a Resin Layer not Transmitting Ultraviolet Light The pencil hardness was measured in accordance with the method of Japanese Industrial Standard K 5400.

(6) Uniformity of a Resin Layer not Transmitting Ultraviolet Light

The uniformity of a resin layer not transmitting ultraviolet light was evaluated by the visual observation. When the resin layer was uniform, the result was expressed as "good". When the resin layer was not uniform (when the resin layer was not uniform even after the irradiation with laser beams), the result was expressed as "poor".

Example 1

One face of a polyethylene terephthalate (PET) film having a thickness of 188 μm was subjected to mat treatment by sand blasting (the roughness of the mat treatment: 0.39 μm as Ra). The treated face was coated with a resin fluid containing carbon black [manufactured by DAINICHI-SEIKA COLOR & CHEMICALS MFG. Co., Ltd.; the trade name: "MU818 BLACK"; the resin component: a vinyl chloride-vinyl acetate copolymer; the average diameter of carbon black: 24 nm; the specific surface area of carbon black: 115 g/m$^2$; the ratio of the amounts by weight of carbon black to the resin component: 0.83/1] in an amount such that the average thickness was 4 μm after being dried. The formed coating layer was dried to form a resin layer not transmitting ultraviolet light, and a material film for a mask film was prepared. The properties of the material film are shown in Table 1.

Example 2

One face of a PET film having a thickness of 188 μm was coated with a resin fluid containing carbon black [manufactured by DAINICHI-SEIKA COLOR & CHEMICALS MFG. Co., Ltd.; the trade name: "MU818 BLACK"; the resin component: a vinyl chloride-vinyl acetate copolymer; the average diameter of carbon black: 24 nm; the specific surface area of carbon black: 115 g/m$^2$; the ratio of the amounts by weight of carbon black to the resin component: 0.83/1] to which 5 parts by weight of synthetic silica having an average particle diameter of 5 μm [manufactured by NIPPON SILICA KOGYO Co., Ltd.; the trade name: "NIPJEL BY600"] per 100 parts by weight in dry basis of the resin fluid containing carbon black was added, in an amount such that the average thickness was 4 μm after being dried. The formed coating layer was dried to form a resin layer not transmitting ultraviolet light, and a material film for a mask film was prepared. The properties of the material film are shown in Table 1.

Comparative Example 1

One face of a PET film having a thickness of 188 μm was subjected to mat treatment by sand blasting (the roughness of the mat treatment: 0.39 μm as Ra). The treated face was coated with a resin fluid containing carbon black [manufactured by DAINICHI-SEIKA COLOR & CHEMICALS MFG. Co., Ltd.; the trade name: "MU1720 BLACK"; the resin component: a vinyl chloride-vinyl acetate copolymer; the average diameter of carbon black: 14 nm; the specific surface area of carbon black: 240 g/m$^2$; the ratio of the amounts by weight of carbon black to the resin component: 0.71/1] in an amount such that the average thickness was 4 μm after being dried. The formed coating layer was dried to form a resin layer not transmitting ultraviolet light, and a material film for a mask film was prepared. The properties of the material film are shown in Table 1.

Comparative Example 2

One face of a PET film having a thickness of 188 μm was coated with a resin fluid containing carbon black [manufactured by DAINICHI-SEIKA COLOR & CHEMICALS MFG. Co., Ltd.; the trade name: "MU818 BLACK"; the resin component: a vinyl chloride-vinyl acetate copolymer; the average diameter of carbon black: 24 nm; the specific surface area of carbon black: 115 g/m$^2$; the ratio of the amounts by weight of carbon black to the resin component: 0.83/1] in an amount such that the average thickness was 4 μm after being dried. The formed coating layer was dried to form a resin layer not transmitting ultraviolet light, and a material film for a mask film was prepared. The properties of the material film are shown in Table 1.

TABLE 1

|  | Example 1 | Example 2 | Comparative Example 1 | Comparative Example 2 |
|---|---|---|---|---|
| Transmittance of Ultraviolet light (360 nm) (%) |  |  |  |  |
| before irradiation with laser beams | 0.1> | 0.1> | 0.1> | 0.1> |
| after irradiation with laser beams | 54.3 | 83.6 | 55.6 | 84.5 |
| Adhesion | 0 | 0 | 4 | 0 |
| Surface roughness Ra (μm) | 0.23 | 0.44 | 0.25 | 0.08 |
| Slipping property with printing plate material of photosensitive resin | good | good | good | poor |
| Pencil hardness | 4H | 5H | 3H | 5H |
| Uniformity of coating | good | good | poor | good |

Example 3

A mask film was prepared using the material film for a mask film obtained in Example 1, and a flexographic printing plate was prepared in accordance with the following procedures.

(1) Preparation of a Mask Film

Patterns of solids, characters of various sizes (the font: Helvetica), lines and nets were created as negative or positive patterns and used for the test of accuracy of printing. The patterns were digitally processed and taken into an apparatus for irradiation with laser beams (a neodymium YAG laser oscillator emitting laser beams having a wavelength of 1064 nm; the output power: 25 kW).

The resin layer not transmitting ultraviolet light of the material film for a mask film prepared in Example 1 was irradiated continuously with the laser beams from the apparatus for irradiation with laser beams, and the etching was conducted tracing the patterns. Thus, a mask film having the size of news paper was prepared.

(2) Preparation of a Flexographic Printing Plate

Using a machine for preparing a flexographic printing plate [manufactured by TAKANO KIKAI SEISAKUSHO Co., Ltd.; the trade name: "DX-A3"], the following successive steps for preparation of a flexographic printing plate were conducted continuously, and a flexographic printing plate was prepared.

The back face of a flexographic printing plate material of a photosensitive resin [manufactured by DU PONT Company; the trade name: "CYREL AQS"; the thickness: 1.7 mm] was irradiated with ultraviolet light having a wavelength of 360 nm for 55 seconds for the preliminary exposure to ultraviolet light. Then, the mask film obtained above in (1) was tightly attached to the front face of the flexographic printing plate material treated above in a manner such that the resin layer not transmitting ultraviolet light of the mask film is attached to the printing plate material and the major exposure to ultraviolet light was conducted via the mask film for 14 minutes.

The mask film was removed from the printing plate material by peeling, and the printing plate material was washed with water containing 3% by weight of a surfactant at 55° C. for 11 minutes and 30 seconds to remove portions not exposed to ultraviolet light. The printing plate material was then dried at 70° C. for 20 minutes and irradiated with ultraviolet light for 35 minutes for the post-exposure to ultraviolet light. Thus, a flexographic printing plate of a size of newspaper having a desired test pattern for printing was obtained.

Printing was conducted using the flexographic printing plate obtained above. The workability including the positioning was excellent, and no problems were found on the condition of the printed product.

What is claimed is:

1. A material film for producing a mask film, said material film comprising a substrate film transmitting ultraviolet light and a resin layer not transmitting ultraviolet light which is disposed on a face of the substrate film, wherein said resin layer has a color which is capable of being eliminated by irradiation with laser beams, has a transmittance of ultraviolet light of 0.1% or smaller before irradiation of the laser light, and has a thickness of 0.1 to 30 μm, and wherein said resin layer comprises carbon black having an average particle diameter of 20 to 50 nm and a specific surface area of 70 to 150 $m^2/g$ as a blackish pigment and has an average surface roughness on a central line Ra of 0.1 to 3 μm.

2. A material film for producing a mask film according to claim 1, wherein the resin layer not transmitting ultraviolet light comprises at least one of vinyl chloride-vinyl acetate copolymers and polyurethane-based resins as a resin.

3. A material film for producing a mask film according to claim 2, wherein a ratio of a content by weight of the blackish pigment and a content by weight of the resin in the resin layer not transmitting ultraviolet light is 0.5:1 to 1:1.

4. A material film for producing a mask film according to claim 3, wherein a surface of the resin layer not transmitting ultraviolet light has a pencil hardness of H or greater.

5. A process for producing a mask film which comprises etching a resin layer not transmitting ultraviolet light in the material film for producing a mask film of claim 4 by irradiation with a laser beam and forming a desired pattern.

6. A process for producing a mask film which comprises etching a resin layer not transmitting ultraviolet light in the material film for producing a mask film of claim 3 by irradiation with a laser beam and forming a desired pattern.

7. A material film for producing a mask film according to claim 2, wherein a surface of the resin layer not transmitting ultraviolet light has a pencil hardness of H or greater.

8. A process for producing a mask film which comprises etching a resin layer not transmitting ultraviolet light in the material film for producing a mask film of claim 7 by irradiation with a laser beam and forming a desired pattern.

9. A process for producing a mask film which comprises etching a resin layer not transmitting ultraviolet light in the material film for producing a mask film of claim 2 by irradiation with a laser beam and forming a desired pattern.

10. A material film for producing a mask film according to claim 1, wherein a ratio of a content by weight of the blackish pigment and a content by weight of the resin in the resin layer not transmitting ultraviolet light is 0.5:1 to 1:1.

11. A material film for producing a mask film according to claim 10, wherein a surface of the resin layer not transmitting ultraviolet light has a pencil hardness of H or greater.

12. A process for producing a mask film which comprises etching a resin layer not transmitting ultraviolet light in the material film for producing a mask film of claim 11 by irradiation with a laser beam and forming a desired pattern.

13. A process for producing a mask film which comprises etching a resin layer not transmitting ultraviolet light in the material film for producing a mask film of claim 10 by irradiation with a laser beam and forming a desired pattern.

14. A material film for producing a mask film according to claim 1, wherein a surface of the resin layer not transmitting ultraviolet light has a pencil hardness of H or greater.

15. A process for producing a mask film which comprises etching a resin layer not transmitting ultraviolet light in the material film for producing a mask film of claim 14 by irradiation with a laser beam and forming a desired pattern.

16. A process for producing a mask film which comprises etching a resin layer not transmitting ultraviolet light in the material film for producing a mask film of claim 1 by irradiation with a laser beam and forming a desired pattern.

17. A process for producing a printing plate of a photosensitive resin which comprises irradiating a photosensitive layer of a printing plate material with an active light through a mask film of claim 16 and developing the irradiated photosensitive layer.

18. A process according to claim 17, wherein the printing plate of a photosensitive resin is a flexographic printing plate.

* * * * *